US009395397B2

(12) United States Patent
Liu

(10) Patent No.: US 9,395,397 B2
(45) Date of Patent: Jul. 19, 2016

(54) APPARATUS AND METHOD FOR MEASURING POWER CONSUMPTION

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Fu-Ming Liu, Shenzhen (CN)

(73) Assignee: ScienBiziP Consulting (Shenzhen) Co., Ltd., Shenzhen (CN)

( * ) Notice: Subject to any disclaimer, the term of this patent is extended or adjusted under 35 U.S.C. 154(b) by 421 days.

(21) Appl. No.: 14/021,145

(22) Filed: Sep. 9, 2013

(65) Prior Publication Data
US 2014/0183952 A1 Jul. 3, 2014

(30) Foreign Application Priority Data
Dec. 27, 2012 (CN) .................. 2012 1 0578344

(51) Int. Cl.
*H02J 3/14* (2006.01)
*G01R 21/06* (2006.01)
*G06F 1/10* (2006.01)
*G01R 21/133* (2006.01)
*H02M 7/02* (2006.01)

(52) U.S. Cl.
CPC .............. *G01R 21/06* (2013.01); *G01R 21/133* (2013.01); *G06F 1/10* (2013.01); *H02M 7/02* (2013.01); *Y10T 307/406* (2015.04)

(58) Field of Classification Search
CPC ........ G01R 21/06; G01R 21/133; G05F 1/10; Y10T 307/406; G06F 1/325
See application file for complete search history.

(56) References Cited

U.S. PATENT DOCUMENTS

| | | | | |
|---|---|---|---|---|
| 2008/0238193 A1* | 10/2008 | Storch | ................. | H01H 43/024 307/10.1 |
| 2009/0128128 A1* | 5/2009 | Garland | ............... | G01R 15/125 324/115 |
| 2011/0127854 A1* | 6/2011 | Cruz | ...................... | H02J 9/005 307/131 |

* cited by examiner

*Primary Examiner* — Daniel Cavallari
(74) *Attorney, Agent, or Firm* — ScienBiziP, P.C.

(57) ABSTRACT

A power consumption measurement apparatus includes a power meter, a multi-meter, and a data collector. The power meter obtains first power consumption data indicative of the power supplied from an AC power supply to an AC-to-DC converter. The multi-meter obtains second power consumption data indicative of the power consumed by each of loads. The data collector synchronously collects the first power consumption data from the power meter and the second power consumption data from the multi-meter. A method for measuring power consumption is also provided.

18 Claims, 2 Drawing Sheets

APPARATUS AND METHOD FOR MEASURING POWER CONSUMPTION

REFERENCE TO RELATED APPLICATIONS

This application claims all benefits accruing under 35 U.S.C. §119 from China Patent Application No. 201210578344.1, filed on Dec. 27, 2012 in the State Intellectual Property Office of China. The contents of the China Application are hereby incorporated by reference.

BACKGROUND

1. Technical Field

The disclosure generally relates to measurement apparatuses and methods, and particularly relates to apparatuses and methods for measuring power consumption.

2. Description of Related Art

Many energy-efficiency programs, such as the Energy Star program, have been developed to identify and promote energy efficient products. The power consumption of an electronic product is of vital importance to designers and consumers. Energy efficiency of an electronic product is a yardstick for evaluation of a product being designed and a factor in the consumers' willingness to purchase the product. However, conventional power consumption measurement may be inefficient and inaccurate.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the views.

DETAILED DESCRIPTION

Figure 1:
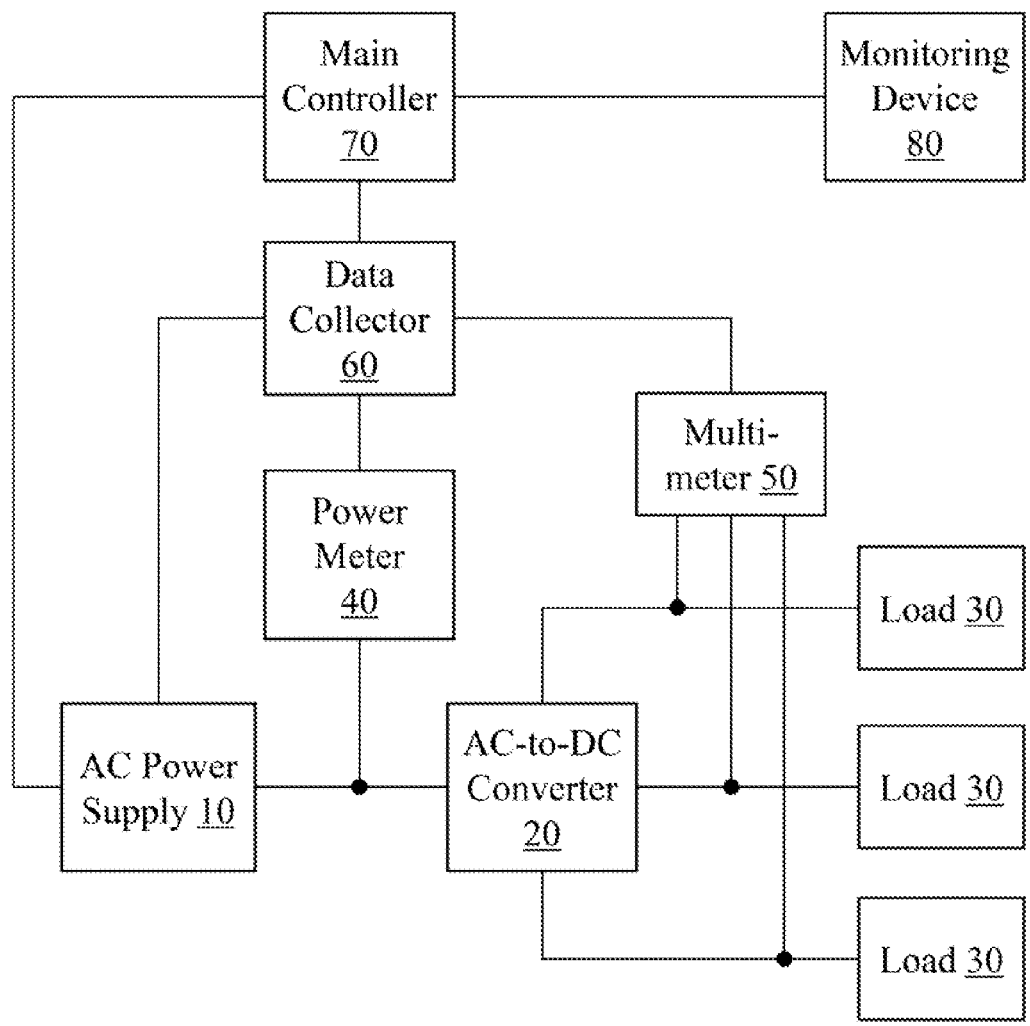
FIG. 1 is a block diagram of one embodiment of an apparatus for measuring power consumption.

The disclosure is illustrated by way of example and not by way of limitation in the figures of the accompanying drawings, in which like reference numerals indicate similar elements. It should be noted that references to "an" or "one" embodiment in this disclosure are not necessarily to the same embodiment, and such references can mean "at least one."

In general, the word "module," as used herein, refers to logic embodied in hardware or firmware, or to a collection of software instructions, written in a programming language such as Java, C, or assembly. One or more software instructions in the modules may be embedded in firmware, such as in an erasable-programmable read-only memory (EPROM). The modules described herein may be implemented as either software and/or hardware modules and may be stored in any type of non-transitory computer-readable medium or other storage device. Some non-limiting examples of non-transitory computer-readable media are compact discs (CDs), digital versatile discs (DVDs), Blu-Ray discs, Flash memory, and hard disk drives.

FIG. 1 shows one embodiment of a power consumption measurement apparatus. The power consumption measurement apparatus includes an AC power supply 10, an AC-to-DC converter 20, a plurality of loads 30, a power meter 40, a multi-meter 50, a data collector 60, a main controller 70, and a monitoring device 80.

The AC power supply 10 may output an AC voltage to the AC-to-DC converter 20. The AC voltage supplied from the AC power supply 10 may be adjusted to have different voltage value and different frequency.

The AC-to-DC converter 20 converts the AC voltage to one or more DC voltages. For example, the AC-to-DC converter 20 can convert an AC 220V voltage to three DC 12V voltages. The AC-to-DC converter 20 outputs the converted DC voltage to the plurality of loads 30.

The power meter 40 measures the power supplied from the AC power supply 10 to the AC-to-DC converter 20.

The multi-meter 50 measures the power consumed by each of the loads 30. The multi-meter 50 measures a DC voltage and a DC current output to each of the loads 30 and calculates the power consumed by each of the loads 30 by multiplying the DC voltage and the DC current.

The data collector 60 is connected to the power meter 40, the multi-meter 50 and the power supply 10. The data collector 60 synchronously collects the power consumption data from the power meter 40 and the multi-meter 50 and the AC voltage data from the AC power supply 10.

The main controller 70 is connected to the data collector 60 and the AC power supply 10. The main controller 70 obtains the power consumption data and the AC voltage data from the data collector 60. The main controller 70 may adjust the AC power supply 10 to output an AC voltage with different voltage value and frequency to the AC-to-DC converter 20.

In some embodiments, the main controllers 70 transmits collection setting parameters to the data collector 60. The collection setting parameters can include, for example, collection frequency and collection duration.

The monitoring device 80 is connected to the main controller 70. In one embodiment, the monitoring device 80 is connected to the main controller 70 via an IP network. The monitoring device 80 may obtain the power consumption data and the AC voltage data from the main controller 70.

Figure 2:
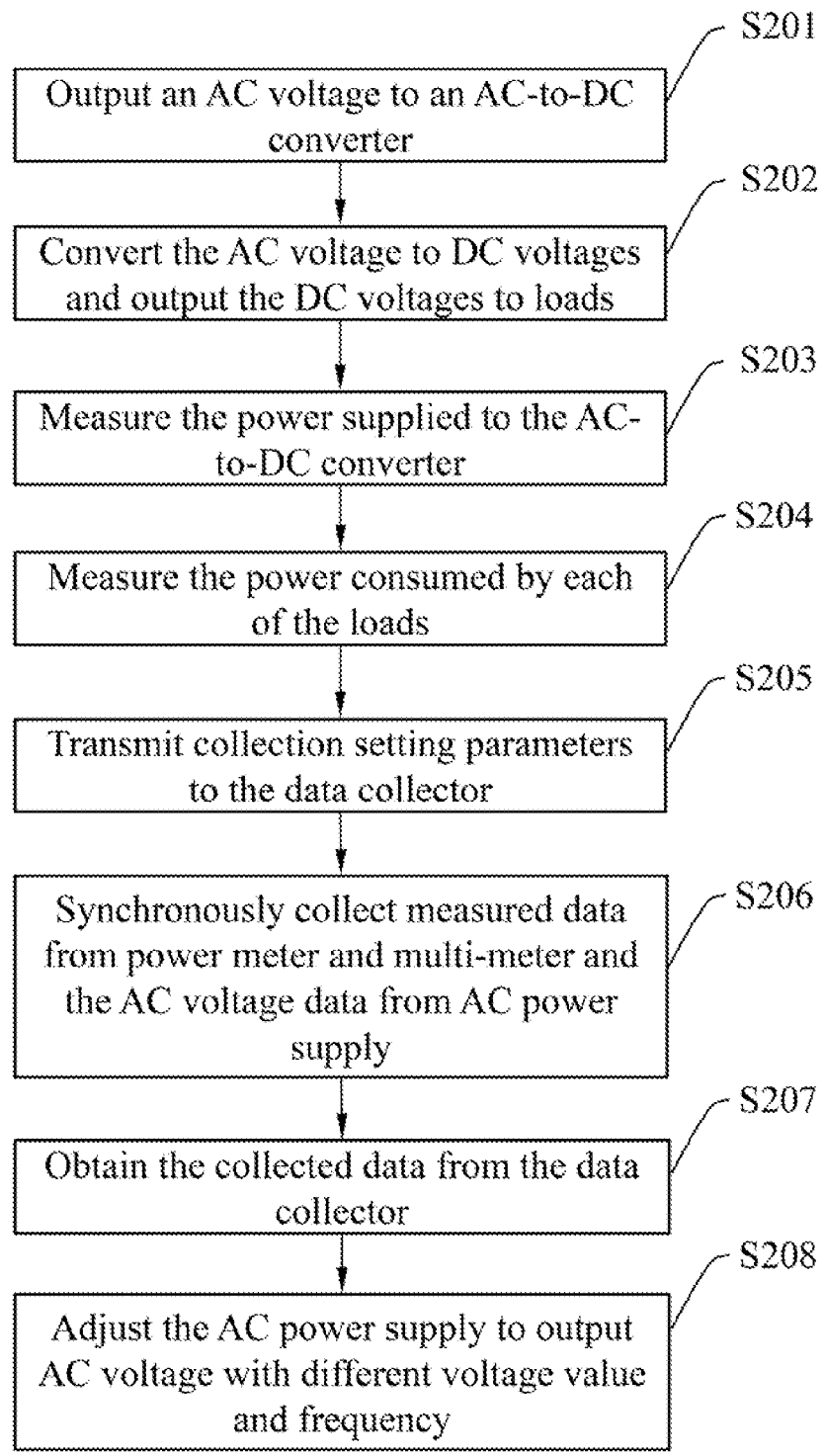
FIG. 2 is a flowchart of one embodiment of a method for measuring power consumption.

FIG. 2 shows a flowchart of one embodiment of a method for measuring power consumption. The method includes the following steps.

In step S201, the AC power supply 10 outputs an AC voltage to the AC-to-DC converter 20.

In step S202, the AC-to-DC converter 20 converts the AC voltage to DC voltages. The AC-to-DC converter 20 outputs the converted DC voltages to the plurality of loads 30.

In step S203, the power meter 40 measures the power supplied from the AC power supply 10 to the AC-to-DC converter 20.

In step S204, the multi-meter 50 measures the power consumed by each of the loads 30. The multi-meter 50 measures a DC voltage and a DC current output to each of the loads 30 and calculates the power consumed by each of the loads 30 by multiplying the DC voltage and the DC current.

In step S205, the main controllers 70 transmits collection setting parameters to the data collector 60. The collection setting parameters can include, for example, collection frequency and collection duration.

In step S206, the data collector 60 synchronously collects the power consumption data from the power meter 40 and the multi-meter 50 and the AC voltage data from the AC power supply 10 according to the collection setting parameters.

In step S207, the main controller 70 obtains the power consumption data and the AC voltage data from the data collector 60.

In step S208, the main controller 70 adjusts the AC power supply 10 to output an AC voltage with different voltage value and frequency to the AC-to-DC converter 20.

Although numerous characteristics and advantages have been set forth in the foregoing description of embodiments, together with details of the structures and functions of the embodiments, the disclosure is illustrative only, and changes may be made in detail, especially in the matters of arrangement of parts within the principles of the disclosure to the full extent indicated by the broad general meaning of the terms in which the appended claims are expressed.

In particular, depending on the embodiment, certain steps or methods described may be removed, others may be added, and the sequence of steps may be altered. The description and the claims drawn for or in relation to a method may give some indication in reference to certain steps. However, any indication given is only to be viewed for identification purposes, and is not necessarily a suggestion as to an order for the steps.

What is claimed is:

1. A power consumption measurement apparatus, comprising:
    an AC power supply;
    an AC-to-DC converter connected to the AC power supply;
    a plurality of loads connected to the AC-to-DC converter, wherein the AC power supply is configured to supplied an AC voltage to the AC-to-DC converter, the AC-to-DC converter is configured to convert the AC voltage to a plurality of DC voltages and output the plurality of DC voltages to the plurality of loads;
    a power meter configured to obtain first power consumption data indicative of the power supplied from the AC power supply to the AC-to-DC converter;
    a multi-meter configured to obtain second power consumption data indicative of the power consumed by each of the plurality of loads; and
    a data collector connected to the power meter and the multi-meter, the data collector being configured to synchronously collect the first power consumption data from the power meter and the second power consumption data from the multi-meter.

2. The power consumption measurement apparatus of claim 1, wherein the data collector is further connected to the AC power supply and configured to obtain AC voltage data indicative of a voltage value and a frequency of the AC voltage supplied by the AC power supply.

3. The power consumption measurement apparatus of claim 2, further comprising a main controller connected to the data collector and configured to obtain the first power consumption data, the second power consumption data, and the AC voltage data from the data collector.

4. The power consumption measurement apparatus of claim 3, wherein the main controller is further configured to transmit collection setting parameters to the data collector, and the data collector is configured to collected data from the power meter and the multi-meter according to the collected setting parameters.

5. The power consumption measurement apparatus of claim 4, wherein the collection setting parameters comprises collection frequency and collection duration.

6. The power consumption measurement apparatus of claim 3, wherein the main controller is further connected to the AC power supply and configured to adjust the voltage value and the frequency of the AC voltage supplied by the AC power supply.

7. The power consumption measurement apparatus of claim 3, further comprising a monitoring device connected to the main controller and configured to obtain the first power consumption data, the second power consumption data, and the AC voltage data from the main controller.

8. The power consumption measurement apparatus of claim 7, wherein the monitoring device is connected to the main controller via an IP network.

9. The power consumption measurement apparatus of claim 1, wherein the multi-meter is configured to measure a DC voltage and a DC current output to each of the plurality of loads and calculate the power consumed by each of the loads by multiplying the DC voltage and the DC current.

10. A power consumption measurement method, comprising:
    supplying an AC voltage to an AC-to-DC converter by an AC power supply;
    converting the AC voltage to a plurality of DC voltages by the AC-to-DC converter;
    outputting the plurality of DC voltages to a plurality of loads by the AC-to-DC converter;
    obtaining first power consumption data indicative of the power supplied from the AC power supply to the AC-to-DC converter by a power meter;
    obtaining second power consumption data indicative of the power consumed by each of the plurality of loads by a multi-meter; and
    synchronously collecting the first power consumption data from the power meter and the second power consumption data from the multi-meter by a data collector.

11. The power consumption measurement method of claim 10, further comprising obtaining AC voltage data indicative of a voltage value and a frequency of the AC voltage from the AC power supply by the data collector.

12. The power consumption measurement method of claim 11, further comprising obtaining the first power consumption data, the second power consumption data, and the AC voltage data from the data collector by a main controller.

13. The power consumption measurement method of claim 12, further comprising:
    transmitting collection setting parameters to the data collector by the main controller; and
    collecting, by the data collector, data from the power meter and the multi-meter according to the collection setting parameters.

14. The power consumption measurement method of claim 13, wherein the collection setting parameters comprises collection frequency and collection duration.

15. The power consumption measurement method of claim 12, further comprising adjusting the voltage value and the frequency of the AC voltage output from the AC power supply.

16. The power consumption measurement method of claim 12, further comprising obtaining the first power consumption data, the second power consumption data, and the AC voltage data from the main controller by a monitoring device.

17. The power consumption measurement method of claim 16, wherein the monitoring device is connected to the main controller via an IP network.

18. The power consumption measurement method of claim 10, further comprising measuring, by the multi-meter, a DC voltage and a DC current output to each of the plurality of loads and calculating the power consumed by each of the loads by multiplying the DC voltage and the DC current.

* * * * *